March 24, 1959 E. CHATTERTON, JR 2,879,344

SEMICONDUCTOR SIGNAL-TRANSLATING CIRCUIT OF VARIABLE GAIN

Filed Sept. 29, 1955

INVENTOR.
EDWARD CHATTERTON JR.
BY

ATTORNEY 2,879,344

SEMICONDUCTOR SIGNAL-TRANSLATING CIRCUIT OF VARIABLE GAIN

Edward Chatterton, Jr., Somerset, Mass., assignor to Philco Corporation, Philadelphia, Pa., a corporation of Pennsylvania Application September 29, 1955, Serial No. 537,391

5 Claims. (Cl. 179—171)

Figure 1:
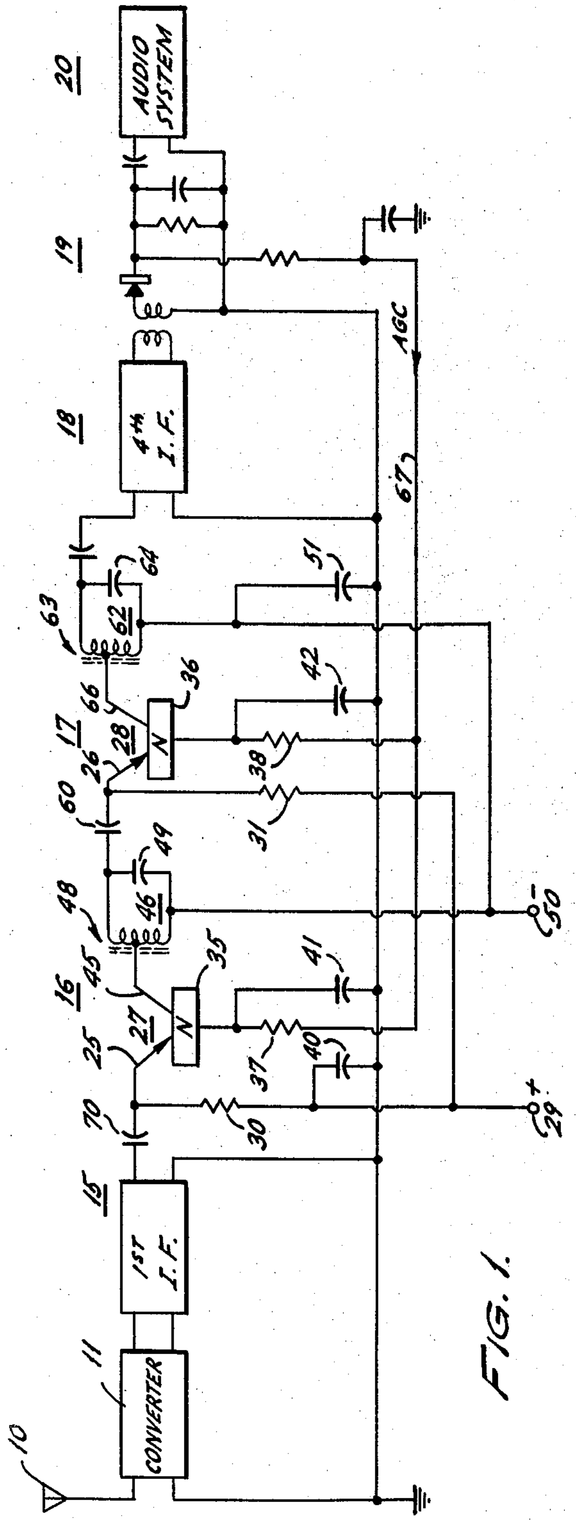

This invention relates to semiconductor signal-translating apparatus utilizing semiconductive devices having control elements characterized by resistances which are subject to variation, and which therefore tend to affect the loading of associated circuits. More particularly the invention relates to apparatus for stabilizing, or controlling variations in, the bandwidth of a semiconductor circuit as its gain is varied.

Previously it has been known to utilize circuit arrangements of one or more semiconductive devices each characterized in that the resistance of at least one control element thereof varies as the operating point of the device is changed, so that the loading of associated circuits is caused to vary in a sense opposite to the resistance variations. One important example of such an arrangement occurs in the case of transistor amplifying circuits which are supplied with a gain-controlling AGC voltage to reduce the variations in output signal level which changes in the level of the applied input signal tend to produce. Such gain control is commonly accomplished by supplying an AGC voltage to one of the elements of the transistor, such as the base or emitter, to vary its resistance. Typically, a change in AGC voltage produced in response to increasing input signal levels causes each controlled transistor to operate at a lower current level, corresponding to increased emitter, collector and base resistances. As a result, the loading effects which the transistor elements exert upon associated tuned circuits tend to decrease as the AGC voltage increases, producing a decrease in bandwidth for increasing input signal levels.

As an example, in the case of a superheterodyne radio broadcast receiver using transistors in the intermediate-frequency amplifier stages to which the AGC voltage is supplied, such an arrangement has the effect of increasing the selectivity and decreasing the signal bandwidth for strong stations, and reducing the selectivity and increasing the signal bandwidth for weak stations, a situation often disadvantageous in such reecivers wherein a bandwidth more nearly constant, or even increasing, with AGC voltage is generally desired. Since the resistances of the transistor elements are ordinarily quite low, and therefore often constitute the principal damping elements across the tuned circuits, such variations in the resistance values of the transistor elements may alter the bandwidth of the complete amplifier very substantially in the direction indicated, often changing it by as much as two or three times.

Accordingly, it is an object of my invention to provide improved signal-translating systems utilizing semiconductive devices, in which changes in the loading of associated circuits which tend to occur in conventional systems in response to changes in the input or output resistances of said devices, are reduced or reversed in direction.

Another object is to provide a transistor signal-translating and/or amplifying circuit comprising a pair of transistors in cascade arrangement and a tuned interstage coupling network between two of said transistors, in which the input resistance of at least the transistor following the tuned circuit is subject to variation, and in which the bandwidth of the entire circuit decreases to a lesser extent than in conventional circuits, in response to increases in said input resistance.

It is a further object to provide a transistor amplifying system including at least one tuned circuit followed by a transistor device, in which the effects of an increasing AGC voltage applied to said following transistor in reducing the bandwidth of the circuit are substantially reduced or overcome.

A further object is to provide a transistor amplifier including at least a pair of transistors and a tuned interstage coupling network, in which the bandwidth of the amplifier is relatively insensitive to variations in the AGC voltage applied to said transistors.

In accordance with the invention, the above objects are achieved by providing, between a semiconductive device whose input resistance is to be varied and the associated circuit whose loading is normally affected by said variations, a primarily reactive element having a reactance large compared with the input resistance of said device. In one preferred embodiment, the semiconductive device is a transistor whose input resistance is varied by an AGC voltage applied to the input terminals thereof, and the associated circuit may typically comprise a tuned interstage network for supplying the input terminals with the output signal of a preceding transistor, which latter transistor may also be subjected to automatic gain control and therefore may itself tend to decrease the loading of the tuned circuit as the gain is reduced.

With this arrangement of circuit elements in accordance with the invention, I have found that variations in the input resistance of the semiconductive device following the associated circuit which are such as to decrease the gain of the device, tend to produce an increase in the loading of the associated circuit, rather than a decrease as in prior art systems. Thus, in applications of the invention to the automatic-gain-controlled I.-F. stages of a transistor radio broadcast receiver, reception of signals of increasing strength tends to produce an increase in the damping of the tuned circuit and a corresponding increase in the bandwidth thereof as is desired in many applications. Where only the transistor following the tuned circuit is supplied with a gain-controlling voltage, the effect of this tendency is to vary the bandwidth of the associated circuit in the manner described. However, this tendency toward broadening of bandwidth with increasing signal level may also be used to oppose or overcome opposite variations introduced elsewhere in the circuit. For example, where the transistor preceding the tuned circuit is also subjected to AGC, the tendency toward undamping caused by increases in the output resistance of the preceding transistor, produced in response to increases in AGC voltage, may be opposed or overcome by the increased damping then provided by the above-described circuit.

Operation of the circuit of the invention appears to depend upon either or both of the following phenomena, namely, that in semiconductive devices such as the transistor, the input impedance is ordinarily primarily resistive at frequencies within its normal operating range, and furthermore, for known transistors of the usual types, the input reactance and input resistance tend to vary substantially proportionally with changes in bias. In the preferred embodiment, the first of these conditions is met in that the semiconductive device has an input impedance which is primarily resistive, and hence exerts a loading effect which is substantially the same as if it were a pure resistance. Since this input resistance is in series with the above-mentioned reactive element of high impedance, variations in the value of the input resistance produce changes in the damping of the tuned circuit of a sense opposite to that which would be produced by similar variations of a resistance in parallel with the tuned circuit. The effect of the large coupling reactance provided in accordance with the invention is therefore to reverse the sense in which changes in the transistor input resistance vary the loading of the tuned circuit, thereby to permit cancellation or overcoming of the bandwidth variations which AGC of the circuit tends to produce.

However, in some embodiments of the invention the reactive component of the input impedance of the semiconductive device may be sufficiently small to produce a substantial signal shunting effect across the input resistance, in which case the desired variation of loading of the preceding circuit in response to variation of the input resistance is enhanced by the fact that the input reactance varies with the input resistance so as to maintain a substantially constant Q for the input impedance. For reasons discussed hereinafter in detail, such a condition of constant Q also tends to produce the desired direction of variation of loading with input resistance variations.

In the preferred embodiment, the high reactance coupling element is a capacitor of small value, which may then serve not only to effect reversal of the damping effect of the transistor input resistance, but also as a blocking condenser for providing D.-C. isolation between stages. However, where an additional blocking capacitor of large value is employed, or where the D.-C. levels permit, an inductor of high Q may be employed instead as the reactive coupling element.

Figure 2:
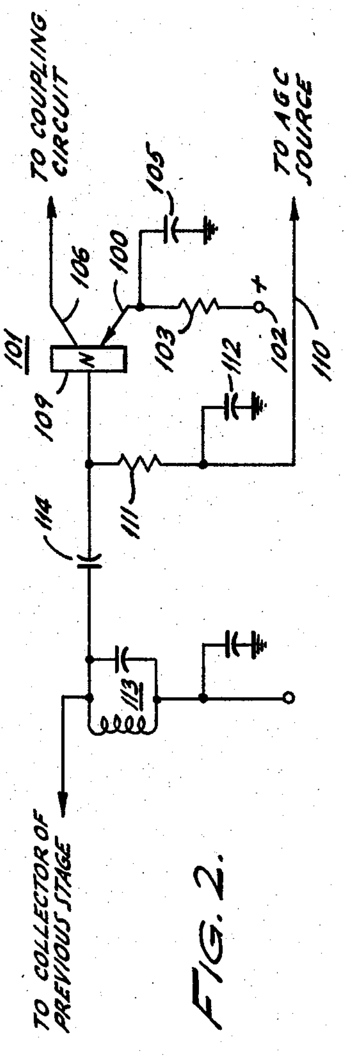

Other objects and features of the invention will be readily comprehended from a consideration of the following detailed description in connection with the accompanying drawings, in which:

Figure 1 is a schematic diagram illustrating one preferred embodiment of the invention; and Figure 2 is a schematic diagram illustrating a possible modification of the arrangement of Figure 1.

Referring now to Figure 1 in detail, the circuit shown is that of a superheterodyne receiver for standard broadcast transmissions, having an automatic gain control system and circuitry in accordance with the invention for modifying the change in bandwidth usually produced by changes in AGC voltage level. In general, the receiver comprises an antenna 10 for intercepting the radio-frequency waves and for applying them to the input terminals of a conventional converter 11, within which the radio-frequency signals are heterodyned to the intermediate-frequency. These signals are then supplied to the intermediate-frequency amplifier comprising a first I.-F. stage 15, a second I.-F. stage 16, a third I.-F. stage 17 and a fourth I.-F. stage 18, connected with their signal paths in cascade. Following the fourth I.-F. stage, there is provided a second detector and AGC source 19 for generating AGC and audio voltages, the latter being supplied to an audio system 20, which may comprise conventional amplyfying and sound reproducing apparatus as commonly employed in radio reception. All elements of the receiver may be conventional except for the second and third I.-F. stages and associated circuits, to which the AGC voltage is supplied and in connection with which the invention will be described.

In this embodiment of the invention, the stages 16 and 17 each comprise a transistor amplifier in the common-base circuit configuration, and the interstage coupling networks are of single-tuned form. More particularly, the emitters 25 and 26 of transistors 27 and 28, respectively, are supplied with a forward biasing potential from supply terminal 29 by way of series resistors 30 and 31, respectively; where, as in the present embodiment, the transistors are of the type having an N-type body, the source of emitter biasing potential is positive with respect to the base, as indicated by the positive sign at terminal 29. The base elements 35 and 36 of transistors 27 and 28, respectively, are connected to a source of reference potential, designated as ground, by way of their respective base resistors 37 and 38 and the AGC circuit 19, which is operative to produce increasingly positive base voltages with increasing signal levels, so as to reduce the gain of stages 16 and 17 for strong signals. The emitter supply terminal 29 is bypassed to ground by means of capacitor 40, while capacitors 41 and 42 provide similar bypassing for base elements 35 and 36, respectively.

The interstage circuit connecting the collector 45 of transistor 27 to the emitter 26 of transistor 28 comprises a single-tuned, resonant circuit 46 in the form of the parallel combination of inductor 48 and capacitor 49, which is tuned to provide the desired gain and bandpass characteristics at the intermediate frequency. The collector 45 is connected to a tap on inductor 48, and collector bias is supplied from negative supply terminal 50 by way of the inductor. A signal bypass capacitor 51 may also be provided between the negative supply terminal and ground, as shown.

In accordance with the invention, and as will be discussed further hereinafter, the high signal-potential end of tuned circuit 46 is connected to the emitter 26 of the following transistor 28 by way of capacitor 60 having a reactance at the operating signal-frequency which is large compared to the input resistance which transistor 28 presents to the signal.

The collector circuit of transistor 28 may be generally similar to that of transistor 27, including a single-tuned circuit 62 comprising the parallel combination of inductor 63 and capacitor 64, connected between collector 66 and negative supply terminal 50 and tuned to the desired intermediate frequency.

The second detector and AGC source 19 may be of any of several conventional forms, and in the interest of simplicity has been shown as a conventional diode detector, so poled as to provide a voltage increasingly positive with respect to ground at lead 67 as the signal level increases. When the AGC voltage is to be applied to the emitter of a transistor having an N-type base, or to the base of a transistor having a P-type base, it will be understood that the polarity of the diode will be reversed, in each instance to provide the polarity of AGC voltage required to reduce the gain of the transistor with increasing input signal level. In the persent case, AGC voltage is supplied to the bases of both of transistors 27 and 28.

In operation, the intermediate frequency signals applied to stages 16 and 17 are amplified therein to an extent depending upon the emitter-to-base operating potentials of transistors 27 and 28, which in turn are determined by the combined effects of the fixed bias voltages and the AGC bias voltages applied thereto. More specifically, as the input signal level increases, the resultant increases in the positive AGC voltages applied to the bases of the two transistors reduce the total emitter-to-base operating biases, thereby increasing the emitter and collector resistances and reducing the signal gains of the stages in a manner which is well known in the art. With a conventional circuit not employing the invention, the increase in emitter resistance of transistor 28 thus produced results in a substantial undamping of the tuned circuit 46 and a corresponding decrease in the width of the signal passband, which is augmented by a contemporaneous increase in the collector resistance of transistor 27. A similar tendency toward bandwidth narrowing occurs due to undamping of tuned circuit 62 by the increasing resistance of the collector of transistor 28, and, in embodiments in which a tuned circuit is used to couple together stages 15 and 16, there may be a further tendency toward bandwidth narrowing due to the increase in resistance of the emitter 25 of transistor 27.

However, using a value of reactance for capacitor 60 which, in accordance with the invention, is large compared to the emitter resistance of transistor 28, the effect on bandwidth of the change in resistance of emitter 26 is reversed. Since the emitter resistance is low compared to the collector resistance, the resultant increase in damping caused by the change in emitter resistance can readily be made to reduce greatly or even to overcome the decrease in damping caused by the change in collector resistance of the preceding transistor 27, thereby to produce a constant or increased damping of tuned circuit 46. Furthermore, where desired, the increase of damping of tuned circuit 46 thus produced may be utilized to oppose or overcome the decrease in damping of tuned circuit 62 caused by increases in the collector resistance of transistor 28, and any decrease in damping of tuned circuits in the first I.-F. stage 15 caused by increases in the emitter resistance of transistor 27; however, it will be understood that the latter effect need not be compensated if the invention is applied also to the network coupling the first I.-F. stage 15 to transistor 27, by using a value of capacitor 70 which provides a reactance large compared to the emitter resistance of transistor 27.

Although I do not wish to be limited by the details of any particular theory, operation in accordance with the invention is believed to depend upon the following considerations. The input impedance of the transistor 28 may be considered as constituted of a resistive input component $R_{pt}$ in parallel with a reactive input component $X_{pt}$, which parallel combination is connected in series with the network reactance $X_{sc}$ of the coupling element 60, across the tuned circuit 46. Since the resistive component of the input impedance of a common-base transistor is characteristically very small compared with the reactive component in parallel therewith, the resistive component predominates over the reactive component in determining the current through the parallel combination. Variations in the input resistance of the transistor such as may be produced by changes in AGC voltage therefore affect the damping of the tuned circuit 46 in substantially the same manner as if the input impedance of the transistor were entirely resistive. However, since this input resistance appears in series with the large reactance of the coupling element 60, variations in the input resistance produce variations of the opposite sense in the equivalent parallel resistance across tuned circuit 46. Increases in the strength of the received signal, which produce increases in AGC voltage and input resistance, therefore result in heavier damping of the tuned circuit and a wider bandwidth, as indicated hereinbefore.

Stated more mathematically, the resistive component $R_{pt}$ of the input impedance of the transistor exerts the same effect upon the damping of the tuned circuit as a resistance $R_{st}$ in series with the reactance $X_{sc}$ of the coupling element 60, where:

$$R_{st}=R_{pt}/1+Q_t^2 \quad (1)$$

$Q_t$ being the ratio of $R_{pt}$ to $X_{pt}$, the input reactance of the transistor. Because of a similar relation between equivalent parallel and series resistances, a resistance $R_{st}$ in series with the coupling reactance $X_{sc}$ will produce a damping effect across tuned circuit 46 equal to that of a resistance $R_{eq}$ in parallel with the tuned circuit and having a value given by the expression:

$$R_{eq}=R_{st}(1+Q_s^2) \quad (2)$$

where $Q_s$ is the Q of the series combination of $R_{st}$ and $X_{sc}$ and may be conveniently expressed as equal to $X_{sc}/R_{st}$. Since in accordance with the invention the reactance $X_{sc}$ of the coupling element is large compared with $R_{pt}$, it is also large compared with $R_{st}$, so that $Q_s$ is large compared with unity and $R_{eq}$ approximately equals $X_{sc}^2/R_{st}$. $R_{eq}$ therefore varies inversely with $R_{st}$, and if, as desired, $R_{eq}$ is also to vary inversely with the input resistance $R_{pt}$, then $R_{st}$ must also vary in the same sense as $R_{pt}$. Referring to the above expression for $R_{st}$ in terms of $R_{pt}$, the desired proportionality may be obtained if $Q_t^2$ is small compared with unity, is substantially constant, or meets both conditions simultaneously.

The first condition, of Q small compared with unity, is met by the arrangement of Figure 1, since typically the resistive component of the input impedance of the transistor in the common-base configuration may be of the order of 60 ohms, while the reactive component may typically be 600 ohms or more; the Q of the input impedance of the transistor is therefore typically less than 0.1, and $Q_t^2$ less than 1%. $R_{st}$ is therefore equal to $R_{pt}$, to a very close approximation, thereby providing the desired proportionality between $R_{st}$ and $R_{pt}$. Where $Q_t$ is greater than 0.1 but less than 1, the denominator of the above expression for $R_{st}$ will be larger and the damping effect of variations in the parallel input resistance $R_{pt}$ will be somewhat less; nevertheless, variations in $R_{st}$ will be in the same sense as variations in $R_{pt}$ so long as $Q_t$ is less than unity.

The second factor mentioned above, namely the constancy of $Q_t$ with variations in $R_{pt}$, also contributes to the desired operation of the circuit in certain cases. In the transistor, it has been found that changes in operating point, such as may be produced by an AGC voltage, produce changes in the resistive and reactive components of the input impedance of the transistor which are substantially proportional to each other, so that the Q of the input impedance remains substantially constant with changes in operating point. Therefore, the embodiment of Figure 1 combines the desirable properties of low $Q_t$ and substantially constant $Q_t$; however, in some embodiments in which $Q_t$ may in some instances be greater than 1, the property of constancy of $Q_t$ with operating point is relied upon to insure the desired direction of variation of damping with change in input resistance. For example, in a modification of the arrangement of Figure 1 to be described hereinafter in detail, in which the transistors are connected in the common-emitter configuration rather than in the common-base configuration, the equivalent parallel input resistance $R_{pt}$ of the transistor is substantially larger than in the common-base configuration, typically being of the order of 1,000 ohms. While the reactive component $X_{pt}$ of the input impedance in many cases will still be larger than the resistive component $R_{pt}$, e.g. 2,000 ohms, in some cases the ratio $R_{pt}/X_{pt}$ may actually exceed unity, in which case it is the substantial constancy of $Q_t$ with operating point which appears to permit the series resistance $R_{st}$ to vary in the same sense as the input resistance $R_{pt}$ of the transistor, as desired. However, in this case, the variation will be substantially reduced due to the increase in $Q_t$, and for this reason such embodiments of the invention are not usually preferred.

The precise value of the coupling capacitor 60 chosen for any particular application will depend upon the requirements of that application. The final relation existing between the bandwidth of the complete amplifier and signal strength will depend upon such factors as the effectiveness of the AGC system in changing the operating point of the controlled transistor, the extent of the variation in resistance of the transistor elements produced by changes in the operating point of the controlled transistor, the magnitude of any resistance connected in shunt with the input impedance of the transistor which tends to dilute the effects of input resistance changes, the reactance of the coupling reactor provided in accordance with the invention, the Q of the tuned circuit employed in the interstage network, the nature of the variation in collector resistance of the preceding stage with changes in AGC voltage in cases in which the preceding stage is also subjected to AGC control, the location of the tap on the interstage tank circuit to which the collector of the preceding stage is connected, and to a lesser extent upon other circuit parameters. Furthermore, the nature of the variation of bandwidth with signal strength which is desired will itself differ in different applications, in some cases preferably being such as to provide a constant bandwidth with increasing input signal and in other applications being such as to provide an increase in bandwidth with increasing signals, as examples. Accordingly, the exact choice of values and adjustment of the circuit for any particular application should be made in view of the requirements of that application and in accordance with the foregoing teachings. However, it may be emphasized that, in any case in which variations in input resistance of the controlled transistor are to be utilized to produce a marked tendency toward bandwidth widening with increasing signal level, the input resistance of the controlled transistor should provide a substantial fraction of the total loading of the tuned circuit, thirty to forty percent being typical in most applications.

The values of the circuit elements required to produce the desired bandwidth variation have been found in general to be compatible with those producing satisfactory gain in a transistor amplifier. Thus, in order to have the input resistance provide a substantial part of the loading of the tuned circuit, it will ordinarily be desirable to avoid shunting of the input resistance by external resistance of lower value, but such shunting will ordinarily be undesirable in any case to avoid power loss into the parallel resistor. Similarly, a coupling reactance of too high a value may result in some loss of amplification because of signal power mismatch. However, the value required by the invention is met for a substantial range of values before the value is so high that significant power mismatch occurs, particularly in view of the impedance differences normally occurring between the output of the preceding transistor and the input of the following transistor. The tap position for the collector of the preceding stage is also significant in this connection, since the further it is tapped down toward the low signal potential end of the tank circuit, the less will be the effect of the collector resistance upon the loading of the following tuned circuit. However, such tapping-down also affects the impedance matching between collector and tuned circuit, and in general tapping-down will be employed to no greater extent than is necessary to achieve the desired bandwidth control.

Although it is not intended thereby to limit the scope of the invention, there will now be given a specific example of the values of the various elements which may be employed in an arrangement in accordance with Figure 1, in which the values have been selected to provide an amplifier bandwith of about 6 kc. which is substantially constant with input signal strength and hence with AGC voltage. In this embodiment, the transistors may be surface-barrier transistors of the general type described in the copending application Serial No. 472,826 of R. A. Williams and J. W. Tiley, filed December 3, 1954, and entitled "Electrical Device," the intermediate frequency may be 455 kc., and the application of the AGC voltage may be limited to transistors 27 and 28, as shown. In this case, the values of the circuit elements may be as follows:

Resistance 30=1,000 ohms
Resistor 31=1,000 ohms
Resistor 37=4700 ohms
Resistor 38=4700 ohms
Capacitor 40=.01 microfarad
Capacitor 41=.01 microfarad
Capacitor 42=.01 microfarad
Capacitor 51=.01 microfarad
Inductor 48=0.55 millihenry
Q of inductor 48=108
Tap on inductor 48=40% down from high potential end of inductor
Capacitor 49=150 to 180 micromicrofarads
Capacitor 60=68 micromicrofarads
Inductor 63=0.55 millihenry
Capacitor 64=150 to 180 micromicrofarads
Capacitor 70=68 micromicrofarads
Positive supply voltage=3 volts
Negative supply voltage=−3 volts With this specific circuit arrangement, it was found that, by increasing the signal level, the overall gain of the amplifier could be reduced from 37 db to 20 db with no substantial variation in bandwidth, and further reduced to about 11 db with a bandwidth increase of about 2 kc. In producing this change in gain, the emitter current of each of the controlled transistors was varied from one-half milliampere to about 0.025 milliampere.

As mentioned hereinbefore, the circuit of the invention may utilize transistor stages arranged in the common-emitter configuration, in which case the circuit may be generally conventional with the exception of the coupling reactance which, in accordance with the invention, has a value large compared with the input resistance of the following stage. The manner in which the circuit of Figure 1 may be modified when the common-emitter configuration is used is shown by Figure 2, which represents a typical gain-controlled I.-F. stage, in which the emitter 100 of transistor 101 is connected to a source of positive bias 102 by way of emitter resistor 103, and is bypassed to ground for signal frequencies by capacitor 105. The collector 106 is connected to a load circuit for supplying the output signals to the next stage. AGC voltage is supplied to base 109 of the transistor from lead 110 by way of a base resistor 111, the AGC lead 110 being bypassed to ground by an audio bypass capacitor 112. Tuned circuit 113 is supplied with signals from the collector of the preceding transistor, which signals are then supplied to base 109 by way of the capacitor 114 which, in accordance with the invention, has a reactance large compared with the input resistance of transistor 101. Operation is analogous to that described hereinabove, and will be apparent to one skilled in the art in view of the foregoing discussion.

Although the invention has been described with particular reference to specific embodiments thereof, it will be understood that it is susceptible of embodiment in any of a variety of forms without departing from the scope thereof.

I claim:

1. A transistor circuit, comprising: a transistor signal-translating device having a pair of input terminals and responsive to a control signal applied to said terminals to vary the input resistance of said device and the gain of said circuit in opposite sense; a parallel-tuned circuit resonant at a predetermined frequency for supplying signals to said transistor device; means responsive to signals of said frequency for deriving, and for applying to said input terminals, a control signal varying in magnitude in accordance with variations in the strength of said signals of predetermined frequency; a primarily reactive element having a reactance at said frequency which is capacitive and larger than said input resistance of said transistor device, and means connecting said reactive element and said input terminals in a series combination disposed effectively in shunt with said tuned circuit, whereby variations in said control signal are caused to vary said input resistance and the loading of said tuned circuit in the same sense.

2. The transistor circuit of claim 1, in which said transistor device comprises a transistor having at least emitter, collector and base elements and connected in the common-emitter connection, and in which said control signal is applied between base and emitter elements thereof.

3. The transistor circuit of claim 1, in which said transistor device comprises a transsistor having at least emitter, collector and base elements and connected in the common-base configuration, and in which said control signal is applied between said base and emitter elements.

4. A transistor circuit comprising a first transistor, a second transistor and an interstage coupling network for supplying the output of said first transistor to said second transistor, said first transistor having control elements responsive to a control signal of increasing magnitude to increase the output resistance thereof while decreasing the gain of said circuit, said second transistor also having control elements responsive to a control signal of increasing magnitude to increase the input resistance thereof while decreasing the gain of said circuit, said interstage network including a parallel tuned circuit resonant at a predetermined frequency and a primarily reactive element connecting said tuned circuit to the input terminals of said second transistor, said reactive element having a reactance at said frequency which is capacitive and larger than said input resistance of said second transistor, means for connecting said reactive element and said control elements in a series combination disposed effectively in shunt with said tuned circuit, and means for applying to each of said control elements a control signal having an absolute magnitude varying in the same sense as variations in the level of signals applied to said first transistor, whereby changes in the loading of said tuned circuit produced by variations in said input resistance of said second transistor are caused to oppose those produced by variations in the output resistance of said first transistor.

5. A transistor circuit comprising: a transistor signal-translating device having a pair of input terminals and responsive to a variable control signal applied to said terminals to vary the input resistance and the gain of said circuit in opposite senses; a parallel-tuned circuit resonant at a predetermined frequency for supplying signals to said transistor device; means for supplying a variable control signal to said terminals; a primarily reactive element having a reactance at said frequency which is larger than said input resistance of said transistor device by a factor of about 10 or more; and means for connecting said reactive element and said input terminals in a series combination disposed effectively in shunt with said tuned circuit, whereby variations in said input resistance due to said control signal are caused to produce variations of the same sense in the loading of said tuned circuit.

References Cited in the file of this patent

UNITED STATES PATENTS

| | | |
|---|---|---|
| 2,691,074 | Eberhard | Oct. 5, 1954 |
| 2,729,708 | Goodrich | Jan. 3, 1956 |

OTHER REFERENCES

Stern article, in Elec. Engineering, December 1944, pp. 1107–1112. (Copy in 179–171–MB.)

Shea text, "Principles of Transistor Circuits," pp. 221–229, 248, 249, pub. 1953 by John Wiley & Sons, Inc., N.Y.C. (Copy in Class. Div. II.)